US000001875H

United States Statutory Invention Registration [19]

[11] Reg. Number: H1,875

Dames

[45] Published: Oct. 3, 2000

[54] ELECTROACOUSTIC TRANSDUCER

[75] Inventor: Andrew Dames, Cambridge, United Kingdom

[73] Assignee: Microtronic A/S, Roskilde, Denmark

[21] Appl. No.: 08/684,048

[22] Filed: Jul. 22, 1996

[51] Int. Cl.[7] ..... H01L 41/04

[52] U.S. Cl. ..... 310/322

[58] Field of Search ..... 310/322, 324

[56] References Cited

U.S. PATENT DOCUMENTS

| | | | |
|---|---|---|---|
| 3,828,143 | 8/1974 | Tims et al. | 179/110 A |
| 3,882,285 | 5/1975 | Nunley et al. | 179/107 E |
| 4,156,800 | 5/1979 | Sear et al. | 310/322 |
| 4,490,640 | 12/1984 | Honda | 310/322 |
| 4,811,816 | 3/1989 | Lin | 310/322 |

FOREIGN PATENT DOCUMENTS

| | | | |
|---|---|---|---|
| 0146933B1 | 7/1985 | European Pat. Off. . | |
| 3309851A1 | 3/1983 | Germany | H04R 17/00 |
| 2018089A | 10/1979 | United Kingdom | H04R 1/00 |

*Primary Examiner*—Daniel T. Pihulic

*Attorney, Agent, or Firm*—Watson Cole Stevens Davis, PLLC

[57] ABSTRACT

An electroacoustic transducer comprises a pair of active piezo electric membranes and a sleeve closed at its ends by the membranes to a form an enclosed rear volume of air. A case accomodates the assembly of sleeve and membranes and provides an enclosed front volume of air between its inner wall and the assembly. An opening in the case to the outside forms a sound pressure output. Each membrane comprises a sandwich of two active piezo layers on a substrate material. Very small thicknesses of the substrate and active piezo layers provides for a correct impedance match to the acoustic load in the ear when used in hearing aids.

12 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

ELECTROACOUSTIC TRANSDUCER

BACKGROUND OF THE INVENTION

1. Field of the Invention

The present invention relates generally to an electroacoustic transducer and more particularly to an electroacoustic actuator and till more particularly to a receiver or loudspeaker for use in hearing aid applications.

2. Description of the Prior Art

An electroacoustic transducer for use in a hearing aid is known in the prior art for instance from GB-A-2.018.089. The transducer disclosed therein makes use of a moving tongue which is moved by an electrical current flowing through a coil of wire and generating a magnetic field. The tongue is placed in a static magnetic field and the electrically generated magnetic field causes movement of the tongue. The tongue is used to displace a mechanical piston or diaphragm thus creating a sound pressure. The conversion of input electrical energy into audible sound pressure energy is thus via magnetic field and mechanical force. The transducer shown in GBA-2.018.089 comprises an acoustic space and two opposite transducer surfaces or membranes moving in mutually opposite directions in use. A problem inherent in this electromagnetic type of prior art receiver resides in the fact that it is relatively complex to produce since it is made up of a considerable number of components. It is not sufficiently sturdy and is often damaged if the hearing aid, in which the transducer is incorporated, is dropped at the floor. Furthermore, it constitutes a major limitation for a good acoustic operation of a hearing aid.

As an alternative to the driving means in the form of a movable tongue the transducer surfaces in the above mentioned GB-A-2.018.089 may be plates of a condenser or ceramic or electret or piezoelectric polymer transducer. The arrangement of a transducer of this type has not been disclosed in the patent.

DE-A1-3.309.851 discloses a transducer membrane for an electroacoustic transducer in which piezo ceramic layers provided with electrodes on both sides are placed close to both sides of the membrane and electrically parallel connected with a view to compensate for temperature dependency, in particular when used in telephones. This prior piezo structure is designed for use in an ordinary telephone and has not been optimized for hearing aid applications.

EP-B1-0 146 933 discloses an alarm sound generator or buzzer for automobiles which comprises a housing with an internal air chamber between two membranes carrying respective piezoelectric elements. Such piezoelectric devices are limited to generation of narrow bands of frequencies as they rely on operating at one or a few resonances.

SUMMARY OF THE INVENTION

The present invention contemplates overcoming the shortcomings encountered within the prior art transducers. In accordance with the invention an electroacoustic transducer comprises at least one pair of active piezo electric membranes and a sleeve closed at its ends by the membranes to form an enclosed volume of air, a rear volume. A case accomodates the sleeve and membranes and provides an enclosed volume, a front volume, between its inner wall and the sleeve and membranes. The case has an opening to the outside which provides a sound pressure output. Each active piezo electric membrane comprises a sandwich of two active piezo layers on either side of a substrate material. The thickness of the piezo layers and substrate material is less than 50 micrometers, respectively.

The very small thicknesses of the substrate and active piezo electric layers enable the achievement of a correct impedance match of the membranes (i.e. degree of stiffness) corresponding to the acoustic load in the ear when used in hearing aids because deformation of the membranes provides a mechanical strain energy therein which approximates the energy stored in the rear volume of the transducer. The thin materials of the membranes imply that less energy is required for causing the movement, i.e. deformation of the membranes, and the remaining part of the input energy is available for compressing the air in the front volume.

Furthermore, in addition to a high efficiency of energy conversion from input electrical power to output sound pressure power the transducer enables the achievement of a broad and flat response over the audible frequency range due to the possibility of positioning the resonance frequency in the upper end of the audible frequency range.

An important advantage of the transducer according to the invention is that a balanced forces structure is provided due to the use of an even number of membranes. Another substantial advantage obtained is a very low weight of the moving elements because of the very thin substrate and piezo layers of the membranes. Together these two features enable the manufacturing of a sturdy, mechanically rigid structure of the transducer which is not susceptible to mechanical shocks and not likely to be broken or otherwise damaged if dropped onto a floor. Furthermore, the structure is well suited for miniaturization so that the transducer may be incorporated into even very tiny hearing aids.

BRIEF DESCRIPTION OF THE DRAWINGS

Various other objects features and attendant advantages of the present invention will be more fully appreciated from the following detailed description when considered in connection with the accompanying drawings wherein.

DETAILED DESCRIPTION

Figure 1:
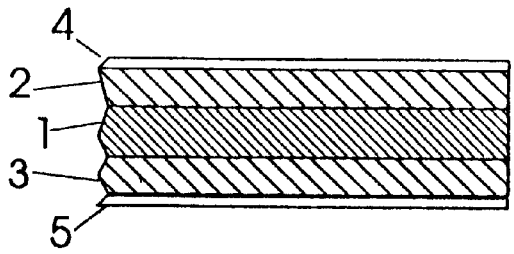
FIG. 1 is a cross-sectional view of part of an embodiment of an active movable element for use in a transducer according to the invention with an electrically conductive substrate.

Referring now to the drawings and more particular to FIG. 1 thereof there is shown a cross-section of part of an active moving element consisting of a sandwich of two active piezoelectric layers 2 and 3 on a respective side of a suitable substrate material 1 in electrical connection therewith. At 4 and 5 are shown electrodes on the outer surface of the piezo layers 2 and 3, respectively.

Figure 2:
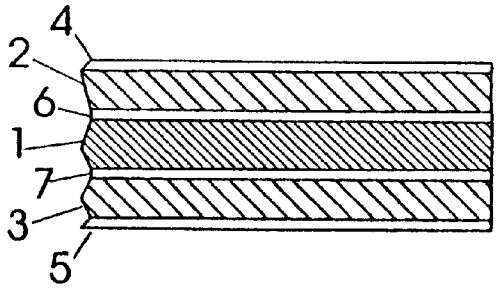
FIG. 2 is a cross-sectional view of part of an embodiment of an active movable element for use in a transducer according to the invention with an electrically insolating substrate.

If alternatively to the electrically conductive substrate 1, for instance of silicon, steel or aluminium, there is used a nonconductive substrate of for example silicon nitride, silicon oxide or plastics material the adjacent surfaces of the piezo layers should be provided with electrodes 6 an 7 similar to the electrodes 4 and 5, shown in FIG. 2.

The piezo layers use a piezo mode where the application of a voltage to the piezo layers 2 and 3 via the electrodes 4 and 5 causes a stress normal to the direction of the applied electric field. The voltage is applied so that one piezo layer contracts and the other expands and if the edges of the moving element are rigidly constrained, the induced stress in the piezo materials causes the moving element to bend dependent on the polarity of the applied voltage.

The described structure of the active moving element enables the achievement of the correct impedance match (i.e. degree of stiffness) for use in the hearing aid transducer. The described membrane provides for a high efficiency between input electrical power and output mechanical power. This is achieved by appropriately controlling the thickness dimension of the substrate and the active piezo elements. Typically for a hearing aid transducer the thickness of the substrate and the thickness of the piezo electric layers is of the order of 1 to 10 micrometers. These dimensions are considerably smaller than used in prior art devices in which the thickness of the piezo layers typically is limited to a minimum of the order of 100 micrometers. For the necessary thin films required by this invention a variety of specialized techniques are available, which include: MOCVD (Metal Organic Chemical Vapour Deposition), Sol-Gel, Bulk Polishing, Vapour Phase Deposition and Physical Vapour Deposition, e.g. Sputtering.

Figure 5:
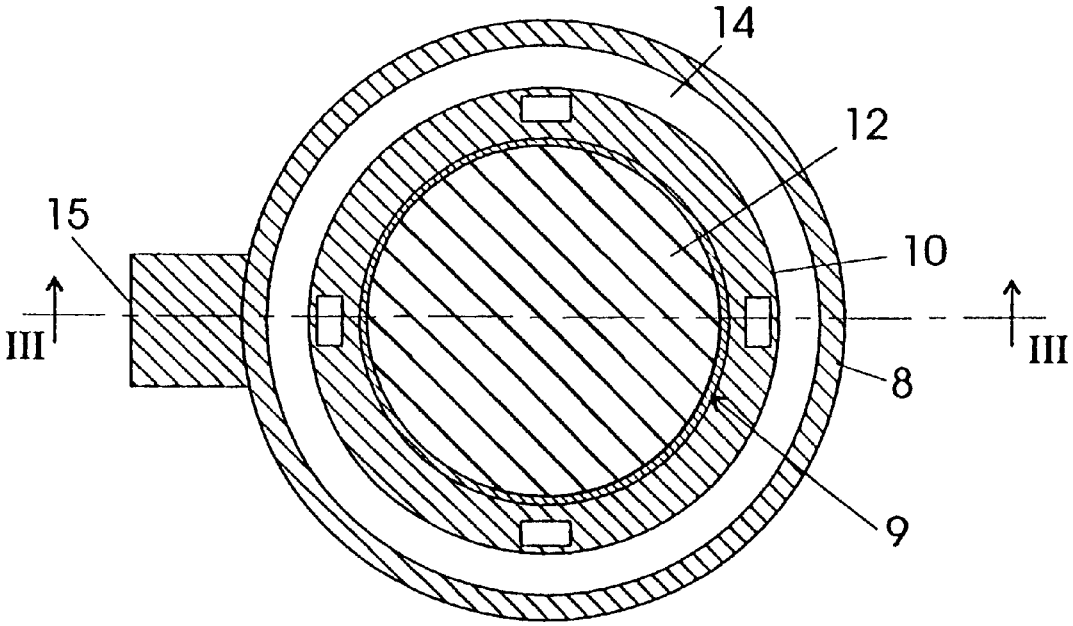
FIG. 5 is a cross-sectional view along the line V—V in FIG. 3.
Figures 3, 4:
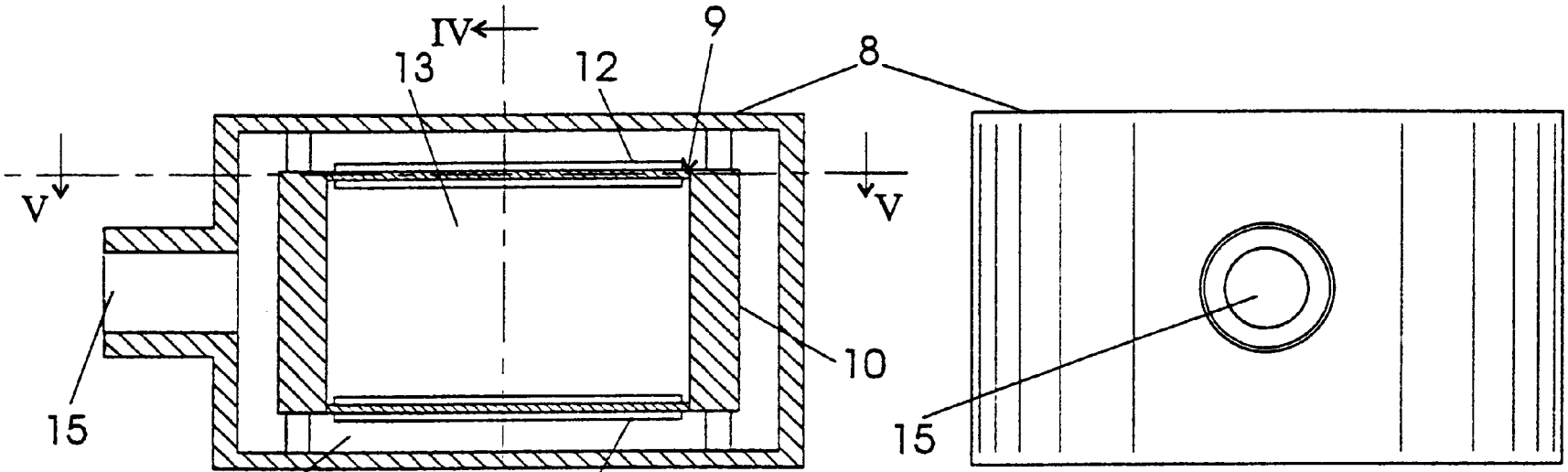
FIG. 3 is a first embodiment of a receiver transducer according to the invention seen from the side and in cross-section along the line III—III in FIG. 5.
FIG. 4 is a cross-sectional view along the line IV—IV in FIG. 3.

In a preferred embodiment of the invention and with reference being made to FIGS. 3,4 and 5, there is provided a piezo electric receiver transducer according to the invention comprising an outer cylindrical case 6 having such dimensions that it is suitable for use in a hearing aid. The case 8 accomodates a unit 9 consisting of a cylindrical sleeve 10 the ends of which are closed by membranes 11 and 12, preferably in the form of active moving elements as shown in FIG. 1 or FIG. 2.

The unit 9 has an enclosed volume of air, a rear volume 13, and the volume between the unit 9 and the internal wall of the case 8 forms a front volume 14 which is open to the outside through a sound opening 15.

In use the two membranes 11 and 12 are electrically coupled in antiphase and when a voltage is applied across the membrane they both bend in a direction to cause the rear volume 13 to be either expanded or compressed, i.e. both inwards or both outwards. At the same time the air in the front volume 14 is compressed or expanded thus inducing a pressure change available in the output sound opening 15. When an a.c. voltage is applied then the pressure in the output sound opening changes at the same frequency as the applied voltage. Thus an audio sound pressure level is generated when an a.c. voltage is applied across the transducer.

In the transducer illustrated in FIGS. 3,4 and 5 the piezo elements are used in the kp mode. This piezo mode is attractive to use as the material property k, the coupling coefficient, is good, which maximizes the efficiency of the conversion of electrical to sound pressure energy.

Figure 7:
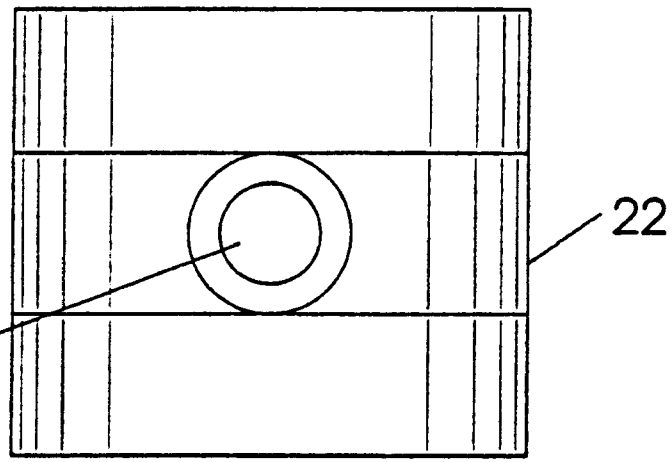
FIG. 7 is a cross-sectional view along the line VII—VII in FIG. 6.
Figure 6:
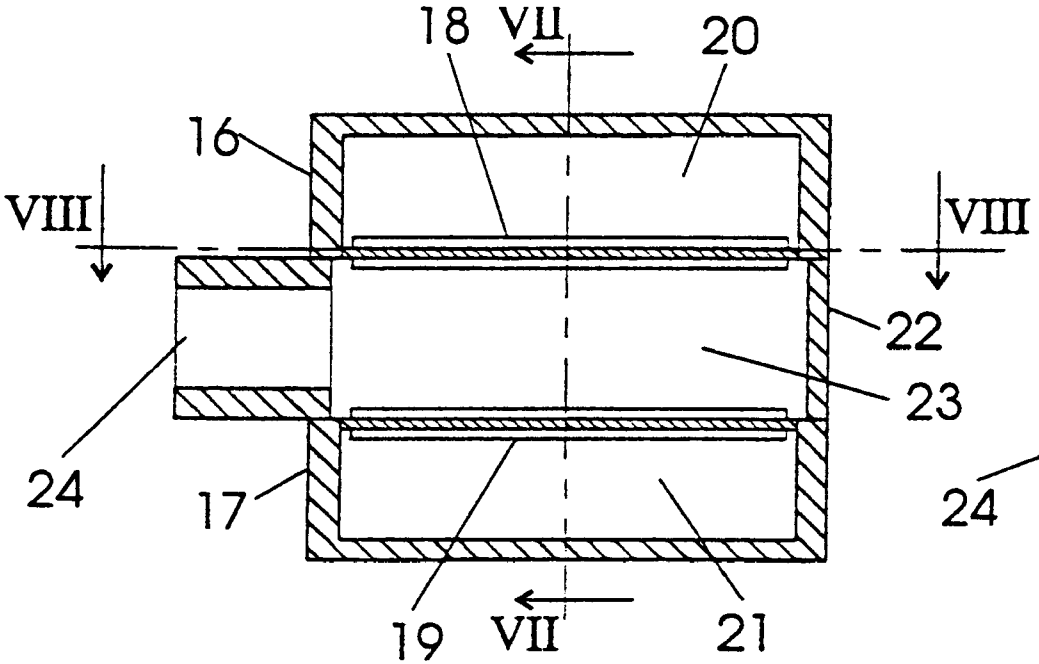
FIG. 6 is a second embodiment of a receiver transducer according to the invention seen from the side and in cross-section along the VI—VI in FIG. 8.
Figure 8:
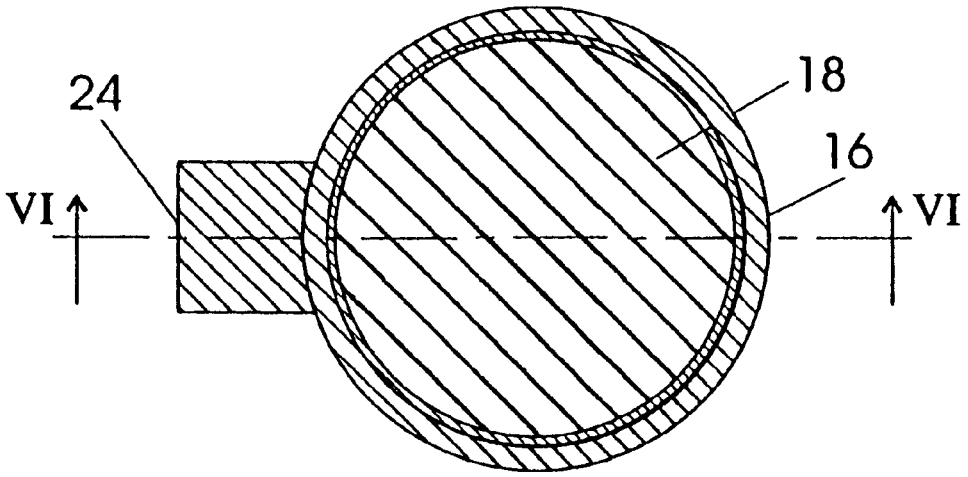
FIG. 8 is a cross-sectional view along the line VIII—VIII in FIG. 6.

In the second preferred embodiment of the invention and with reference being made to FIGS. 6, 7 and 8 there is provided a receiver transducer having a cylindrical case as the embodiment of FIGS. 3,4 and 5 but which is divided into two half cases which are closed by a respective membrane 18 and 19 thereby to enclose a respective rear volume 20 and 21.

Between the two membranes 18 and 19 within a surrounding case wall portion 22 there is provided a front volume 23 which has a sound opening 24 to the outside.

Similar to the membranes 11 and 12 in FIGS. 3,4 and 5 the membranes 18 and 19 in FIGS. 6,7 and 8 are coupled in antiphase and when a voltage is applied across the membranes, they both bend in a direction to cause compression or expansion of the air in the front volume 23 thereby causing a pressure change in the sound opening 24. Thus the operation of this embodiment is similar to that of the embodiment shown in FIGS. 3,4 and 5.

Figure 9:
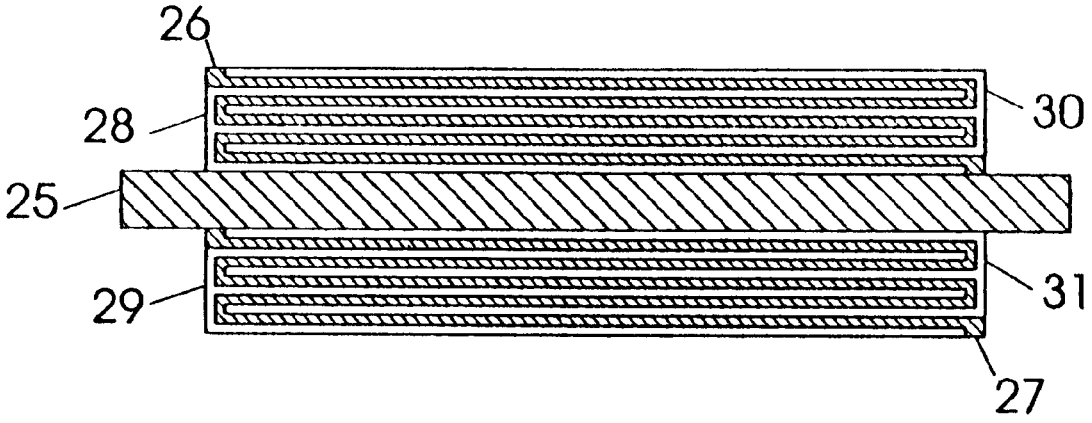
FIG. 9 is a cross-sectional view of a membrane of a multiplicity of electrodes and active piezo layers on either side of the substrate according to the invention.

FIG. 9 of the drawings is a cross-sectional view of a membrane with a multiplicity of electrodes 28,29,30 and 31 and active piezo layers 26 and 27 on either side of the substrate 25. Either the thickness of the layers or the voltages across them may be chosen such that the mechanical bend strain and induced piezo strains are optimally matched.

What is claimed is:

1. An electroacoustic transducer comprising at least one pair of active piezo electric membranes and a sleeve closed at its ends by said membranes to form an enclosed volume of air, a rear volume, a case accomodating said sleeve and said membranes and providing an enclosed volume of air, a front volume, between its inner wall and said sleeve and membranes, said case having an opening to the outside which provides a sound pressure output, wherein each active piezo electric membrane comprises a sandwich of two active piezo layers on either side of a substrate material, the thickness of said piezo layers and substrate material being less than 50 micrometers, respectively.

2. An electroacoustic transducer according to claim 1, wherein the thickness of said piezo layers and of said substrate is less than 10 micrometers.

3. An electroacoustic transducer according to claim 1, wherein said substrate material is electrically conductive.

4. An electroacoustic transducer according to claim 1, wherein said substrate material is electrically nonconductive, said piezo layers each being provided with an electrode on its side adjacent to the substrate.

5. An electroacoustic transducer according to claim 1, wherein the piezo layers are made of a ceramic material by one of a variety of specialized techniques which include: MOCVD (Metal Organic Chemical Vapour Deposition), Sol-Gel, Bulk Polishing, Vapour Phase Deposition and Physical Vapour Deposition, e.g. Sputtering.

6. An electroacoustic transducer according to claim 1, wherein each said membrane consists of a multiplicity of electrodes and active piezo layers on either side of the substrates.

7. An electroacoustic transducer comprising two active piezo electric membranes, a cylindrical case closed at its ends and divided by said two membranes into two end compartments and an intermediate compartment, each said end compartment forming an enclosed volume of air, a rear volume, and said intermediate compartment forming a front volume which is open to the outside through an opening in the case, said opening providing a sound pressure output, wherein each active piezo electric membrane comprises a sandwich of two active piezo layers on either side of a substrate material.

8. An electroacoustic transducer according to claim 7, wherein the thickness of said piezo layers and said substrate is less than 50 micrometers, respectively.

9. An electroacoustic transducer according to claim 7 wherein said substrate material is electrically conductive.

10. An electroacoustic transducer according to claim 7 wherein said substrate material is electrically non-conductive, said piezo layers each being provided with an electrode on its side adjacent to the substrate.

11. An electroacoustic transducer according to claim 7 wherein the piezo layers are made of a ceramic material by one of a variety of specialized techniques which include: MOCVD (Metal Organic Chemical Vapour Deposition), Sol-Gel, Bulk Polishing, Vapour Phase Deposition and Physical Vapour Deposition, e.g. Sputtering.

12. An electroacoustic transducer according to claim 7 wherein each said membrane consists of a multiplicity of electrodes and active piezo layers on either side of the substrates.

* * * * *